(12) United States Patent
Yang et al.

(10) Patent No.: US 10,041,637 B2
(45) Date of Patent: Aug. 7, 2018

(54) RANDOMLY BENDABLE AND SHAPABLE LED LIGHT BAR

(71) Applicant: GUANGZHOU WUDU OPTICAL-ELECTRICAL TECHNOLOGY CO., LTD, Guangzhou (CN)

(72) Inventors: Yi Yang, Guangzhou (CN); Qingqiang Yu, Guangzhou (CN)

(73) Assignees: Yi Yang (CN); Li Xin Thomas Li, Hong Kong (HK); Zhongping Liu (CN)

( * ) Notice: Subject to any disclaimer, the term of this patent is extended or adjusted under 35 U.S.C. 154(b) by 21 days.

(21) Appl. No.: 15/252,294

(22) Filed: Aug. 31, 2016

(65) Prior Publication Data

US 2017/0328527 A1    Nov. 16, 2017

(30) Foreign Application Priority Data

May 12, 2016   (CN) ..................... 2016 2 0437517 U

(51) Int. Cl.
*F21S 4/26* (2016.01)
*H01L 33/62* (2010.01)
(Continued)

(52) U.S. Cl.
CPC .............. *F21S 4/26* (2016.01); *H01L 27/156* (2013.01); *H01L 33/486* (2013.01); *H01L 33/56* (2013.01); *H01L 33/62* (2013.01); *F21W 2121/00* (2013.01)

(58) Field of Classification Search
None
See application file for complete search history.

(56) References Cited

U.S. PATENT DOCUMENTS

| | | | | |
|---|---|---|---|---|
| 5,404,282 A | * | 4/1995 | Klinke ...................... | F21K 9/00 257/E25.028 |
| 6,371,637 B1 | * | 4/2002 | Atchinson ............. | F21V 19/005 362/249.04 |

(Continued)

FOREIGN PATENT DOCUMENTS

| CN | 201297533 Y | 8/2009 |
|---|---|---|
| CN | 201531785 U | 7/2010 |
| CN | 204554481 U | 8/2015 |

OTHER PUBLICATIONS

CN201593717U—Shaped LED flexible neon lamp, Huangm Sep. 29, 2010, machine translation.*

*Primary Examiner* — Britt D Hanley
(74) *Attorney, Agent, or Firm* — Schmeiser, Olsen & Watts, LLP

(57) ABSTRACT

A randomly bendable and shapeable LED light bar is provided, including a plurality of LED light strings in parallel, a shaping metal rod and an insulating wrapping layer, wherein each LED light string includes two fine leads in parallel and a plurality of LED light emitting units; an anode and a cathode of each LED light emitting unit are welded/soldered with the two fine leads; the two fine leads are electrically connected with an anode and a cathode of a power supply; the plurality of LED light strings are parallel to the shaping metal rod and are both wrapped by the insulating wrapping layer. Compared with the prior art, the randomly bendable and shapeable LED light bar disclosed is relatively flexible, can be formed into various rich shapes, and is convenient to mount and shape, reliable in light emission, relatively high in practicability and relatively wide in application range.

7 Claims, 8 Drawing Sheets

(51) Int. Cl.
*H01L 33/48* (2010.01)
*H01L 27/15* (2006.01)
*H01L 33/56* (2010.01)
*F21W 121/00* (2006.01)

(56) References Cited

U.S. PATENT DOCUMENTS

| | | | | |
|---|---|---|---|---|
| 2005/0030765 | A1* | 2/2005 | Southard | G09F 9/33 |
| | | | | 362/559 |
| 2006/0221609 | A1* | 10/2006 | Ryan, Jr. | F21K 9/00 |
| | | | | 362/238 |
| 2009/0154156 | A1* | 6/2009 | Lo | F21V 5/00 |
| | | | | 362/234 |
| 2012/0243212 | A1* | 9/2012 | Smith | H05K 1/028 |
| | | | | 362/183 |
| 2013/0249394 | A1* | 9/2013 | Fay | B60Q 1/0088 |
| | | | | 315/77 |
| 2013/0264591 | A1* | 10/2013 | Hussell | H01L 33/36 |
| | | | | 257/88 |
| 2014/0104828 | A1* | 4/2014 | Wei | F21V 19/0045 |
| | | | | 362/223 |
| 2014/0146536 | A1* | 5/2014 | Li | H05K 1/119 |
| | | | | 362/249.02 |
| 2015/0069442 | A1* | 3/2015 | Liu | H01L 33/504 |
| | | | | 257/98 |
| 2016/0178133 | A1* | 6/2016 | Kong | H01L 25/075 |
| | | | | 362/382 |
| 2017/0084809 | A1* | 3/2017 | Jiang | H01L 33/644 |
| 2017/0287883 | A1* | 10/2017 | Marutani | H01L 25/0753 |

* cited by examiner

RANDOMLY BENDABLE AND SHAPABLE LED LIGHT BAR

CROSS-REFERENCE TO RELATED APPLICATION

This application claims priority to CN 201620437517.1, having a filing date of May 12, 2016, the entire contents of which are hereby incorporated by reference.

FIELD OF TECHNOLOGY

The following relates to the field of decorative lighting, and in particular to an LED light bar.

BACKGROUND

LED lamps are characterized by their energy conservation, environment protection, soft and even light, various hues and the like, and win great popularity among customers. Recent developments in LEDs permit them to be available in various forms and be widely used in holiday decoration, home decoration, city lighting project and various entertainment places.

The existing LED light bars are mostly manufactured by using flexible PCBs. For example, the patent CN 201520243185.9 discloses a SMD flexible PCB light bar, and FIG. 1 shows the part sectioned view of the SMD-type flexible PCB light bar of the related art. The SMD-type flexible light bar comprises a filament 11, a coating layer 12 which coats the filament 11, a plurality of flexible PCBs 13 and a plurality of SMD-type LED chips 14 thereon. The filament 11 is provided along its length with a passage 111, wherein the flexible PCBs are sequentially disposed. The side wall 115 of the filament 11 is sequentially provided with a through-hole, wherein the SMD-type LED chips 14 are arranged. The filament 11 is further provided with a groove 113 and a connecting wire 15, which is electrically connected with the flexible PCBs 13.

The SMD-type flexible PCB light bar above has numerous shortcomings in its design and functionality. For example, it is likely to be broken and further make the LED chips 14 desoldering while it is twisted and bent randomly, due to the limited flexibility of the flexible PCBs 13. Just as the SMD-type flexible light bar cannot be twisted or bent randomly, the light bar cannot take on different shapes but only a singular shape. In addition, it is inconvenient to install and set the SMD-type flexible light bar, whose installation and set depend on the exterior buckles and grooves. All in all, the SMD flexible PCB light bar above is greatly limited in its application.

SUMMARY

An aspect relates to a randomly bendable and shapeable LED light bar.

The following technical scheme is adopted in embodiments of the invention:

A randomly bendable and shapeable LED light bar, comprising a plurality of LED light strings in parallel, a shaping metal rod and an insulating coating layer, wherein each LED light string comprises two fine wires in parallel and a plurality of LED light emitting units; the anode and the cathode of each LED light emitting unit are respectively welded/soldered and fixed with the two fine wires; the two fine wires are respectively electrically connected with the anode and the cathode of a power supply; the plurality of LED light strings are parallel to the shaping metal rod and wrapped by the insulating wrapping layer.

Compared with the prior art, the randomly bendable and shapeable LED light bar of embodiments of the invention substitutes the common flexible PCBs for the fine wires, which have a better flexibility and thus can avoid the situation where the LED light emitting unit is likely to be broken or de-welded/dislocated while it is twisted and bent randomly. The shaping metal rod enables the randomly bendable and shapeable LED light bar to be effectively set or shaped without rebounding deformation after being formed in various shapes. Therefore, the randomly bendable and shapeable LED light bar disclosed by embodiments of the invention has such a better flexibility as to be easily shaped into various forms and to be conveniently set or shaped. In addition, the randomly bendable and shapeable LED light bar of embodiments of the invention is simple in structure and low in cost.

Further, the randomly bendable and shapeable LED light bar comprises an anode power supply wire and a cathode power supply wire which are insulated from each other, wherein the two fine wires of each LED light string are respectively electrically connected with the anode power supply wire and the cathode power supply wire; the anode power supply wire and the cathode power supply wire are parallel to a plurality of LED light strings and coated by the insulating coating layer.

Further, the insulating coating layer comprises an outer coating layer and an inner coating layer, which is provided with a longitudinal groove, wherein the LED light strings are inserted; the anode power supply wire, the cathode power supply wire and the shaping metal rod are all embedded into the inner wrapping layer, which is wrapped by the outer wrapping layer.

As the longitudinal groove for accommodating the LED light strings is formed in the inner wrapping layer, the manufacturing difficulty of the longitudinal groove is lower than that of modes such as injection molding wrapping. As the inner wrapping layer is wrapped by the outer wrapping layer, the situation that the LED light strings get loose from the longitudinal groove can be avoided.

Further, the LED light emitting units, and the welded/soldered parts between the LED light emitting units and the fine wires are coated with epoxy resin, which can achieve a better fixed effect and a better insulation.

Further, the fine wires are enameled wires with good insulation.

Further, the anode power supply wire and the cathode power supply wire are both stranded wires. Compared with the metal wires of the same diameter, the stranded wires have a relatively good bending property.

Further, the LED light emitting units adopt the common and cheap Surface Mount LED.

Further, the inner wrapping layer is made of transparent materials, and the outer wrapping layer is made of transparent materials or vaporous light transmitting material.

BRIEF DESCRIPTION

Some of the embodiments will be described in detail, with reference to the following figures, wherein like designations denote like members, wherein.

DETAILED DESCRIPTION

The randomly bendable and shapeable LED light bar disclosed by an embodiment of the present invention comprises a plurality of LED light strings in parallel, a shaping metal rod and an insulating wrapping layer, wherein each LED light string comprises two fine wires in parallel and a plurality of LED light emitting units; the anode and the cathode of each LED light emitting unit are respectively welded/soldered and fixed with the two fine wires; the two fine wires are respectively electrically connected with the anode and the cathode of a power supply; the plurality of LED light strings are parallel to the shaping metal rod and wrapped by the insulating wrapping layer.

Embodiment 1

Figure 1:
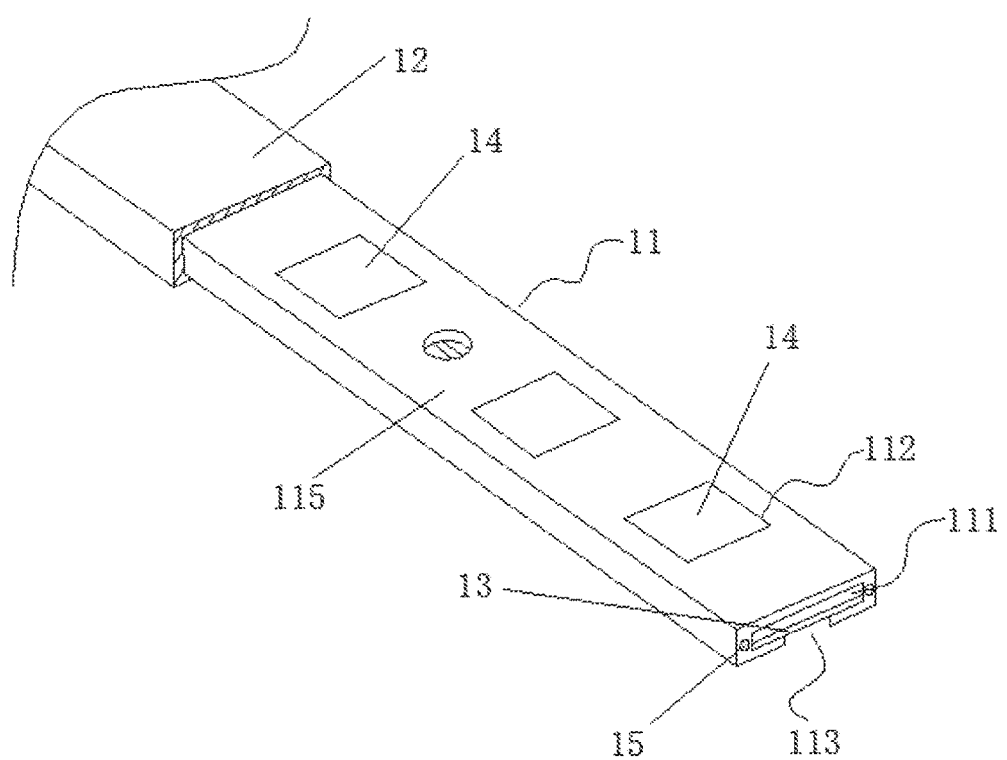
FIG. 1 shows the part sectioned view of the SMD-type flexible light bar of the related art.
Figure 2:
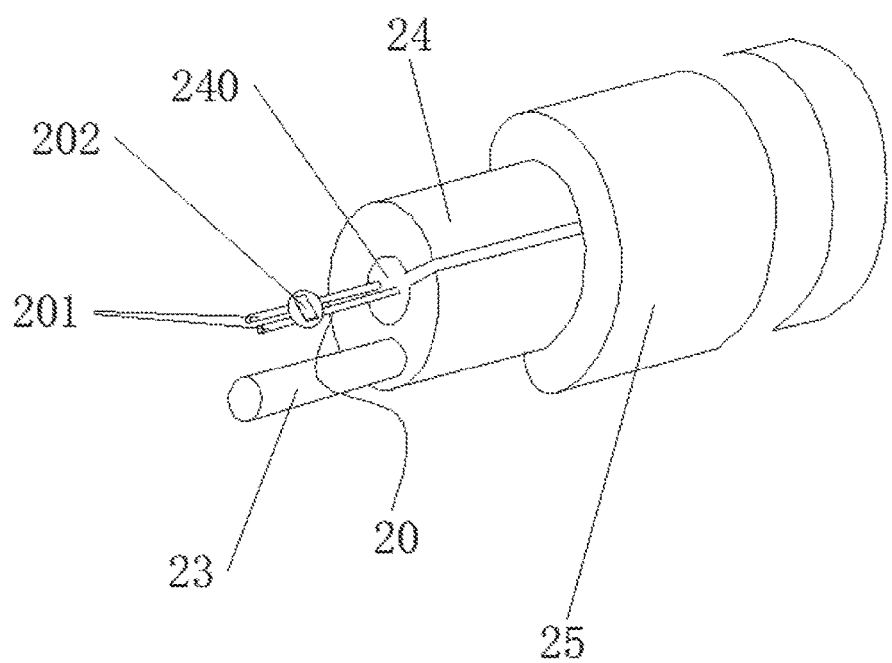
FIG. 2 shows the section view of the embodiment 1.
Figure 3:
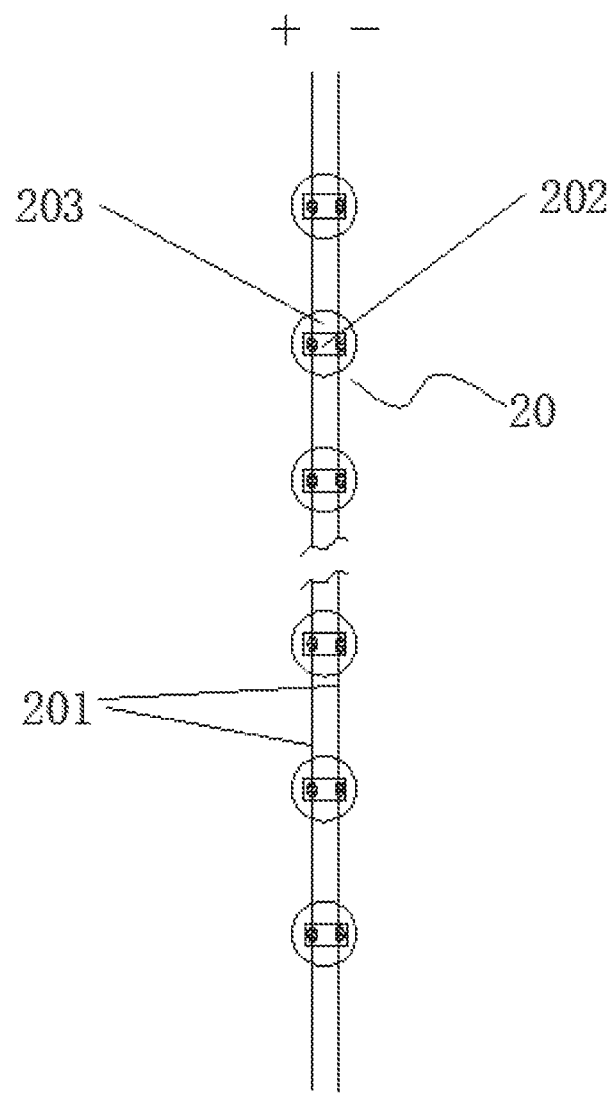
FIG. 3 shows the electrical schematic diagram of the embodiment 1.

FIG. 2 shows the section view of the embodiment 1 and the electrical schematic diagram of the embodiment 1 is shown in FIG. 3, wherein the dots refer to the welding points.

The randomly bendable and shapeable LED light bar disclosed by the embodiment 1 comprises LED light strings 20, a shaping metal rod 23 and an insulating wrapping layer, wherein each LED light string comprises two fine wires 201 in parallel and a plurality of LED light emitting units 202; the anode and the cathode of each LED light emitting unit 202 are respectively welded/soldered and fixed with the two fine wires 201; the two fine wires 201 are respectively electrically connected with the anode and the cathode of a power supply; the plurality of LED light emitting units 202 are connected in parallel; the LED light strings 20 are parallel to the shaping metal rod 23 and are both wrapped by the insulating wrapping layer.

The fine wires 201 of the LED light strings 20 are enameled wires with good insulation. The size of each fine wire 201 is much smaller than that of a flexible PCB used in the prior art, so that the light emitted from the LED light emitting units 201 will not be greatly shaded. The LED light emitting units 202 adopt the common and cheap SMD LED or LED beads. The LED light emitting units, the welded/soldered parts of the LED light emitting units 202 and the fine wires 201 are encapsulate and fixed through epoxy resin 203. As the LED light emitting units 202 are encapsulated and fixed on the fine wires 201 through epoxy resin 203, a good fixing effect can be achieved, and the purpose of insulation can be achieved.

The shaping metal rod 23 can be made of metal materials such as copper, aluminum and steel, or of enameled wires. The thickness of the shaping metal rod 23 can be determined by the size of the randomly bendable and shapeable LED light bar. Through simple tests, technicians of the technical field can easily choose the shaping metal rod 23 of appropriate thickness, so that the randomly bendable and shapeable LED light bar will not get rebounded or deformed after being twisted and bent, thus achieving the shaping effect.

The insulating wrapping layer comprises an inner wrapping layer 24 and an outer wrapping layer 25, a longitudinal groove 240 is formed in the inner wrapping layer 24, the LED light strings 20 are embedded into the longitudinal groove 240, and the shaping metal rod 23 is embedded into the inner wrapping layer 24. The inner wrapping layer 24 is wrapped by the outer wrapping layer 25. The inner wrapping layer 24 is made of a transparent material, and the outer wrapping layer 25 is made of a transparent material or a vaporous light transmitting material.

As the longitudinal groove 240 for accommodating the LED light strings 20 is formed in the inner wrapping layer 24, the manufacturing difficulty is lower than that of modes such as injection molding wrapping. As the inner wrapping layer 24 is wrapped by the outer wrapping layer 25, the situation that the LED light strings 20 are loosened from the longitudinal groove 240 can be avoided.

When a longer LED light bar is needed, a plurality of randomly bendable and shapeable LED light bars can be combined to form a longer LED light bar, that is, the fine wires 201 which are connected with the anode of the power supply, of the plurality of randomly bendable and shapeable LED light bars, are connected end to end in sequence, and the fine wires 201 which are connected with the cathode of the power supply are connected end to end in sequence at the same time.

Embodiment 2

Figure 4:
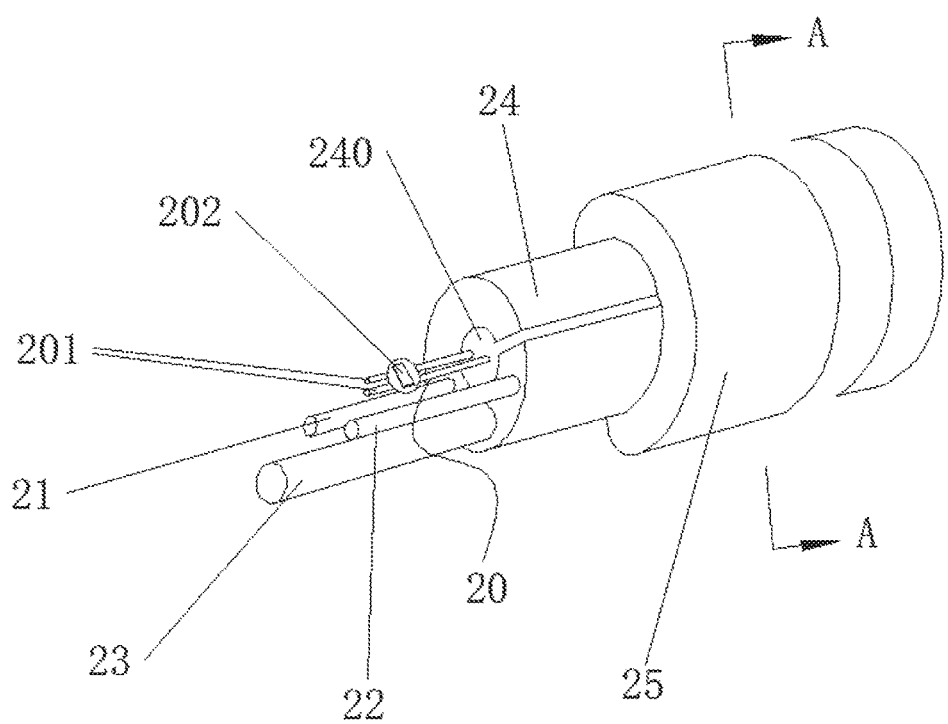
FIG. 4 shows the section view of the embodiment 2.
Figure 5:
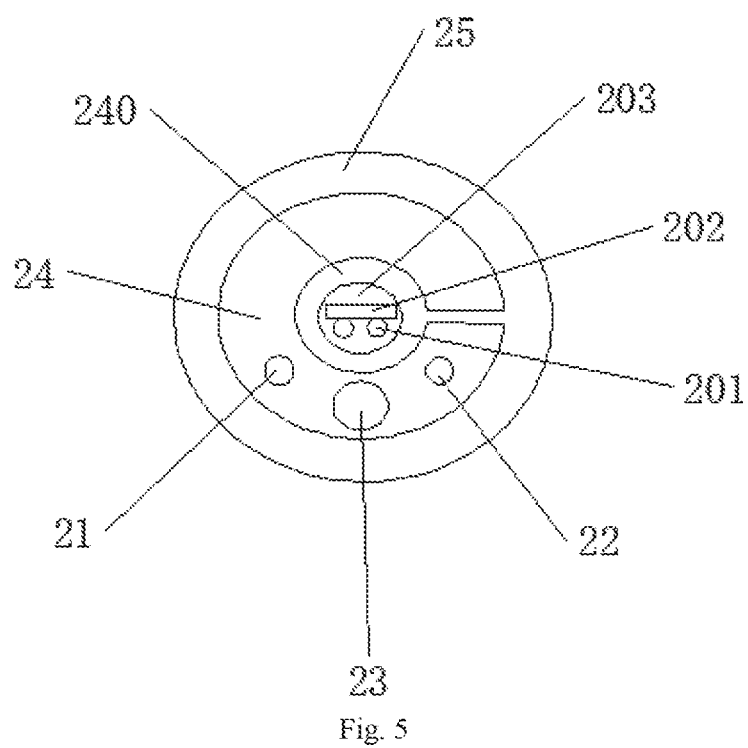
FIG. 5 shows the sectional view of A-A in FIG. 4.
Figure 6:
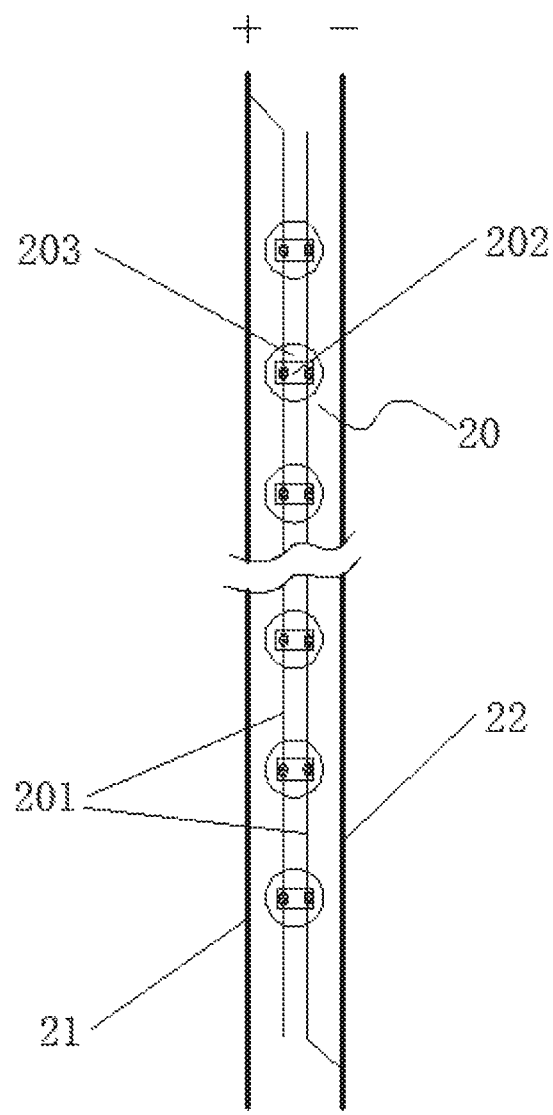
FIG. 6 shows the electrical schematic diagram of the embodiment 2.

FIG. 4 is the profile view of the embodiment 2, FIG. 5 is the sectional view of A-A of FIG. 4, FIG. 6 is the electric schematic diagram of the embodiment 2, and the dots in FIG. 6 are welding points.

The randomly bendable and shapeable LED light bar disclosed by the embodiment 2 is of the generally same structure as that of the randomly bendable and shapeable LED light bar disclosed by the embodiment 1, and the differences are that the randomly bendable and shapeable LED light bar disclosed by the embodiment 2 further comprises an anode power supply wire 21 and a cathode power supply wire 22 which are electrically connected with the anode and the cathode of the power supply respectively. The anode power supply wire 21 and the cathode power supply wire 22 are insulated with respect to each other. One end of a fine wire 201 is electrically connected with the anode power supply wire 21, and one end of another fine wire 201 is electrically connected with the cathode power supply wire 22. The anode power supply wire 21 and the cathode power supply wire 22 are parallel to the LED light strings 20 and are both wrapped by the insulation wrapping layer. The anode power supply wire 21 and the cathode power supply wire 22 are both embedded into the inner wrapping layer 24. The anode power supply wire 21 and the cathode power supply wire 22 are both stranded wires such as aluminum stranded wires, copper stranded wires and copper woven wires, and compared with the metal wires of the same diameter, the stranded wires are relatively good in bending property.

When a longer LED light bar is needed, a plurality sections of the randomly bendable and shapeable LED light bar can be combined to form a longer LED light bar, that is, the anode power supply wires 21 of the plurality sections of the randomly bendable and shapeable LED light bar are connected head to end in sequence, and the cathode power supply wires 22 are connected head to end in sequence at the same time.

The technical scheme of the embodiment 2 is better than that of the embodiment 1.

In Embodiment 1, the two fine wires 201 are directly connected with the anode and the cathode of the power supply electrically. When the plurality sections of the randomly bendable and shapeable LED light bars are combined, equivalently, more LED light emitting units 202 are connected in parallel, and if a normal light emitting effect is achieved for each LED light emitting unit 202, the two fine wires 201 need to bear relatively great current. The maximum carrying capacity of the wires are in a significant positive correlation with the cross sectional area, and the cross section areas of the two fine wires 201 are to be increased if the two fine wires 201 need to bear relatively great current. However, the thicker the two fine wires 201 are, the poorer the flexibility of the two fine wires is, the difficulty in welding the two fine wires 201 with the LED light emitting units 202 is increased, the welding area is also increased, and the LED light emitting units 202 can easily de-weld/dislocated when being randomly twisted and bent.

In this embodiment, the two fine wires 201 are respectively electrically connected with the anode and the cathode of the power supply through the anode power supply wire 21 and the cathode power supply wire 22. When multiple sections of the randomly bendable and shapeable LED light bars are combined together, a normal light emitting effect can be achieved for each LED light emitting unit 202. The anode power supply wire 21 and the cathode power supply wire 22 bear the total current of a primary circuit, and the current borne by the two fine wires 201 of the randomly bendable and shapeable LED light bar is same as that before combination. Therefore, the two fine wires 201 can be still relatively fine enameled wires with relatively good flexibility, and the welding difficulty and welding area with the LED light emitting units 202 is reduced. Even being randomly twisted and bent, the LED light emitting units 202 are not easily de-welded/dislocated.

Embodiment 3

The randomly bendable and shapeable LED light bar disclosed by the embodiment 3 is of the generally same structure as that of the randomly bendable and shapeable LED light bar disclosed by the embodiment 2, and the difference is that the embodiment 3 further comprises two LED light strings, that is, an LED light string 20 and an LED light string 20'.

Figure 7:
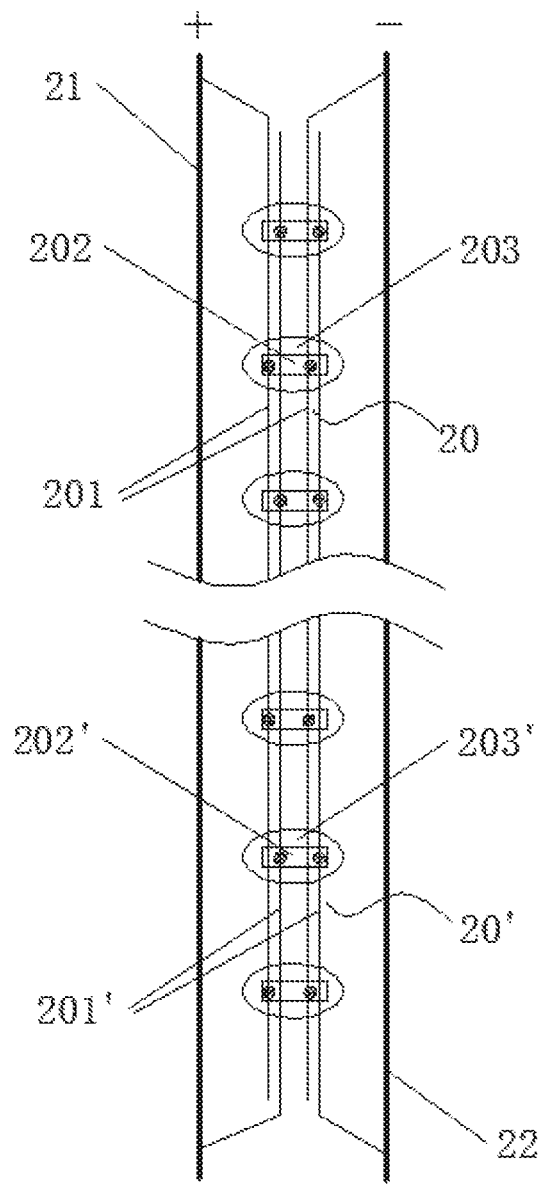
FIG. 7 shows the electrical schematic diagram of the embodiment 3.

Please refer to FIG. 7 which is the electric schematic diagram of the embodiment 3, and the dots in Fig. are welding points.

The LED light string 20 is parallel to the LED light string 20'. Multiple LED light emitting units 202 of the LED light string 20 and multiple LED light emitting units 202' of the LED light string 20' are distributed at intervals. The LED light emitting units 202 and the LED light emitting units 202' can be SMD LED of different light emitting colors, so as to achieve a colorful light emitting effect.

The two fine wires 201 of the LED light string 20 are connected and fixed with epoxy resin 203' of the LED light string 20'; the two fine wires 201' of the LED light string 20' are connected and fixed with the epoxy resin 203 of the LED light string 20. By this method, the LED light string 20 can be tightly connected with the LED light string 20' without relative displacement.

In addition to the technical schemes of the embodiments above, the present invention also has other embodiments of multiple variations, for example, a relatively rich light emitting effect can be achieved by more than two LED light strings, the light emitting effect can be relatively well controlled by electrically connecting the embodiments of the present invention with an LED driving IC, and in addition, the plurality of LED light emitting units can be uniformly distributed at intervals or arranged in other rules.

Figure 8:
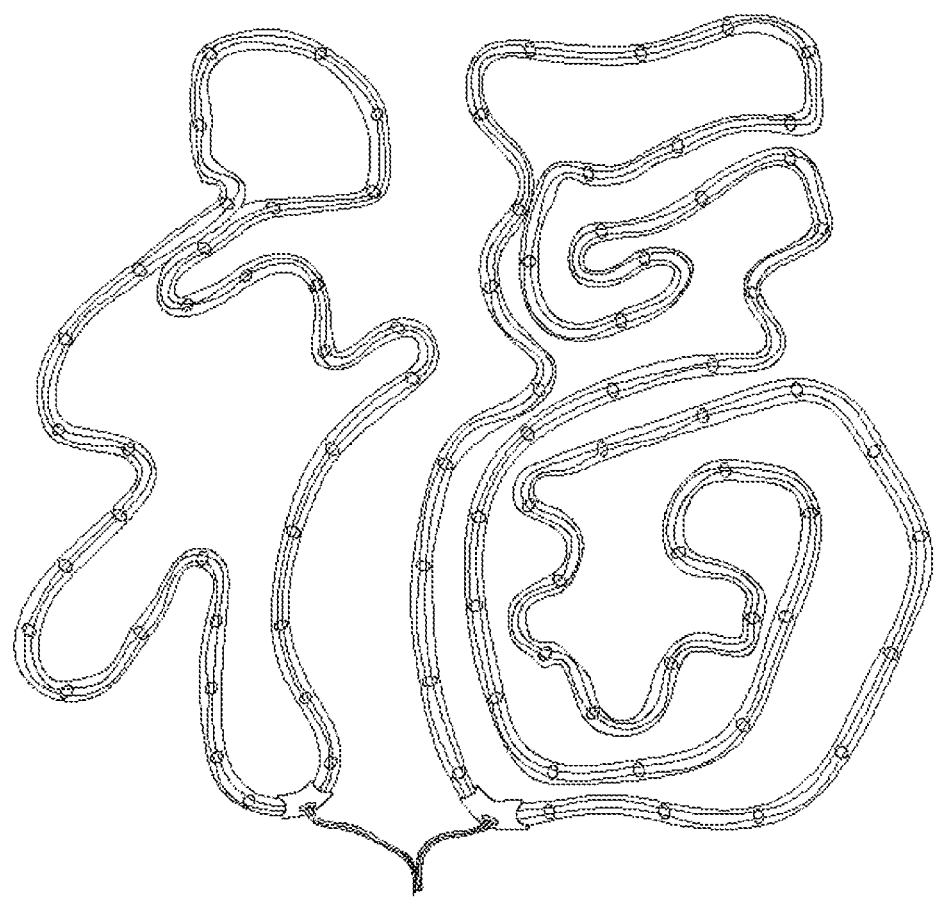
FIG. 8 shows the reference diagram of an embodiment of the present invention.

As shown in FIG. 8, due to the characteristic that the randomly bendable and shapeable LED light bar can be twisted and bent in any direction, two randomly bendable and shapeable LED light bars can be adopted to form a light decoration Chinese character "Fu(福)". One of the randomly bendable and shapeable LED light bars can form the radical "礻" of the Chinese character, the head is connected to the end, and the anode power supply wire and the cathode power supply wire are led out at the connecting part. Another randomly bendable and shapeable LED light bar can be adopted to form a Chinese character "口", the head is connected to the end, and the anode power supply wire and the cathode power supply wire can be led out at the connecting part. The randomly bendable and shapeable LED light bar disclosed is internally provided with the shaping metal rod, so no extra shaping mechanism is needed for shaping.

This method can also be applied to form English (or another language) letters, symbols or characters.

Compared with the known art, the randomly bendable and shapeable LED light bar of the present embodiments of the invention adopt the fine wires to replace normal flexible PCBs. The fine wires are good in flexibility, that is, the LED light emitting units cannot de-weld/dislocated even when the randomly bendable and shapeable LED light bar is twisted and bent in any direction. Due to the shaping metal rod, the randomly bendable and shapeable LED light bar can be effectively shaped without rebounding deformation after being formed in various shapes, so that the mounting convenience is improved. Therefore, the randomly bendable and shapeable LED light bar disclosed is good in flexibility, can be formed into various rich shapes, and is convenient to mount and shape, reliable in light emission, relatively high in practicability and relatively wide in application range. In addition, the randomly bendable and shapeable LED light bar is simple in structure and low in cost.

The present invention is not limited to the above embodiments. All modifications and changes of the present invention made without departing from the spirit of the disclosure or from the scope of the appended claims shall fall within the protective scope of the claims of the present invention.

What is claimed is:

1. A randomly bendable and shapeable LED light bar, comprising:
a plurality of LED light strings in parallel, a shaping metal rod, and an insulating wrapping layer, wherein each LED light string comprises two fine wires in parallel and a plurality of LED light emitting units; an anode and a cathode of each LED light emitting unit are respectively welded/soldered and fixed with the two fine wires; the two fine wires are respectively electrically connected with an anode and a cathode of a power supply; the plurality of LED light strings are parallel to the shaping metal rod and are both wrapped by the insulating wrapping layer; the insulating wrapping layer comprises an inner wrapping layer and an outer wrapping layer; a longitudinal groove is formed in the inner wrapping layer; the LED light strings are inserted into the longitudinal groove; the anode power supply wire, the cathode power supply wire, and the shaping metal rod are all embedded into the inner wrapping layer; and the inner wrapping layer is wrapped by the outer wrapping layer.

2. The randomly bendable and shapeable LED light bar according to claim 1, further comprising an anode power supply wire and a cathode power supply wire which are insulating with each other, wherein the two fine wires of each LED light string are respectively electrically connected with the anode power supply wire and the cathode power supply wire; the anode power supply wire and the cathode power supply wire are parallel to the plurality of LED light strings and are both wrapped by the insulating wrapping layer.

3. The randomly bendable and shapeable LED light bar according to claim 2 wherein the LED light emitting units, and the welded/soldered parts of the LED light emitting units and the fine wires are encapsulated and fixed through epoxy resin.

4. The randomly bendable and shapeable LED light bar according to claim 3, wherein the fine wires are enameled wires.

5. The randomly bendable and shapeable LED light bar according to claim 4, wherein the anode power supply wire and the cathode power supply wire are both stranded wires.

6. The randomly bendable and shapeable LED light bar according to claim 5, wherein the LED light emitting units are Surface Mount LED.

7. The randomly bendable and shapeable LED light bar according to claim 6, wherein the inner wrapping layer is made of a transparent material, and the outer wrapping layer is made of a transparent material or a vaporous light transmitting material.

\* \* \* \* \*